United States Patent [19]

Martin

[11] Patent Number: 4,901,324

[45] Date of Patent: Feb. 13, 1990

[54] HEAT TRANSFER DEVICE FOR COOLING AND TRANSFERRING HEAT FROM A LASER DIODE DEVICE AND ASSOCIATED HEAT GENERATING ELEMENTS

[75] Inventor: Danny W. Martin, St. Charles, Mo.

[73] Assignee: Laser Diode Products, Inc., Earth City, Mo.

[21] Appl. No.: 286,069

[22] Filed: Dec. 19, 1988

[51] Int. Cl.$^4$ ................................................ H01S 3/04
[52] U.S. Cl. ........................................ 372/36; 372/35
[58] Field of Search ...................... 372/36, 34, 35, 33, 372/41, 72, 75

[56] References Cited

U.S. PATENT DOCUMENTS 3,482,185 12/1969 Smith et al. ............................ 372/36
4,791,634 12/1988 Miyake .................................. 372/34
4,805,177 2/1989 Martin et al. .......................... 372/36

FOREIGN PATENT DOCUMENTS 0284980 12/1986 Japan ..................................... 372/35

*Primary Examiner*—Frank Gonzalez

*Attorney, Agent, or Firm*—Haverstock, Garrett & Roberts

[57] ABSTRACT

In a laser device having a laser medium and a laser pumping device associated therewith the improvement including an apparatus for efficiently dissipating heat generated in the laser medium to maintain the laser medium at a more suitable operating temperature, the apparatus including an elongated closed ended heat pipe having a first portion in closely spaced proximity and in heat conductive relationship to the laser medium and a second remote end portion in heat conductive relationship to a heat sink, the heat pipe having an outer conductive layer with a coating of a fluid absorbing material positioned therein and forming a passage therethrough, and a heat transfer fluid positioned in the heat pipe and absorbed by the absorbent material, the absorbed fluid adjacent to the laser medium heating when exposed to the heat generated in the laser medium whereby the fluid moves through the heat pipe to a remote location for conduction of the heat therein into the heat sink.

19 Claims, 2 Drawing Sheets

HEAT TRANSFER DEVICE FOR COOLING AND TRANSFERRING HEAT FROM A LASER DIODE DEVICE AND ASSOCIATED HEAT GENERATING ELEMENTS

BACKGROUND OF THE INVENTION

The present invention relates to a device which aids in maintaining certain of the heat generating elements associated with a laser device at or below some desired operating temperature, and more specifically to a heat transfer device that facilitates extraction of heat away from a heat producing device such as a laser medium and controls the temperature of the laser medium independently of the temperature of other nearby elements including associated pump sources. The device also includes means to rapidly convey extracted heat from the medium to a remote location where the heat can be dissipated efficiently.

It is common knowledge that operating a laser medium, such as a YAG laser crystal, at a relatively cool temperature improves the performance of the laser. It is also known that failure to adequately cool a laser medium produces undesirable operation results and limitations including producing undesirable thermal lensing, poor conversion efficiency in the medium and reduces the laser output, all of which adversely affect the operation and performance of the laser. The present invention teaches the construction and operation of improved means for extracting, conveying and dissipating heat generated by a laser medium, and it does so independently of the operation and heat sinking associated with other portions of the laser including with the pump sources.

There are in existence devices for dissipating heat generated by the active elements of a laser device to maintain the elements at some efficient or relatively efficient operating temperature. However, no known device until now includes means to efficiently transfer heat from a device such as a laser medium using a heat pumping or pump like action. This means that with known heat dissipating devices associated with lasers, the heat extraction and dissipation means had to be located very closely adjacent to the laser medium to be effective. This has physical and operational limitations that are not desirable for various reasons including for maintaining a uniform or relatively uniform temperature throughout the main laser heat sink for best operation. This, at least in part, is because some portions of the heat dissipation means must necessarily be located closer to the heat generating elements than others so that those portions located closest to the laser medium become relatively hotter than other more remote portions of the heat dissipation means, and the heat dissipation means therefore may develop hot spots which are highly undesirable and may damage portions of the heat sink. These same close in portions of the heat dissipation means must also be able to dissipate heat faster than the more remote portions of the heat dissipation means if the device is to operate efficiently. This means that certain portions of the heat sink means must operate more efficiently, that is, dissipate more heat than other portions, and this is not always, if ever, possible to achieve.

As a result, most known laser heat dissipation elements operate relatively inefficiently. Further, because the heat dissipation elements and the circuit elements associated with lasers such as with diode pumped lasers often are mounted on the same circuit board, the known heat dissipating elements limit the component placement possibilities and may even prevent placement of some of the components on the same board. Also, any electrical and/or audible noise generated in and by the heat dissipation elements may produce feedback into the circuit of the laser diodes and adversely affect the operation of the circuit.

The present invention overcomes these and other disadvantages and shortcomings of known laser devices and teaches the construction and operation of an improved heat pipe construction for efficiently extracting and transferring heat from the active heat generating elements of a device. This includes especially the heat generated in a laser medium which should be transferred to a heat dissipating device such as a heat sink. In the present construction the heat from the medium may be transferred to a remote location on the heat sink from the heat generating element. The construction and operation of the present heat pipe employed in the present device enable it to maintain a device such as a laser medium at an efficient operating temperature. The present heat extraction and transfer means also makes possible the best possible placement and location for all of the various elements of the laser and contributes to operating efficiency. Furthermore, by mounting the present heat pipe along the length of a heat dissipating device or heat sink, the temperature differential from end-to-end in the heat sink is able to be maintained relatively low which is an advantage. This is because the heat sink absorbs heat from the heat pipe along substantially the entire length of the heat pipe. Thus, a heat dissipating element having the present heat pipe mounted along its length operates very efficiently to a large extent because all portions of the heat dissipation means are receiving heat and therefore are being utilized.

A preferred embodiment of the present heat extraction and transfer device or pipe includes an elongated tubular housing having spaced end portions with exterior and interior surfaces. The pipe is a thin wall member constructed of a heat conductive metal such as copper or other highly conductive material. A fluid absorbing material is disposed within the pipe shaped housing and substantially completely lines the interior surface thereof but also provides an open passage therethough. A working or heat transfer fluid is positioned within the pipe and is absorbed in its liquid state by the fluid absorbing material. The fluid is disposed to be carried thereby or to move therethrough from adjacent to one end of the housing to adjacent to the opposite end thereof.

The fluid absorbing material therefore defines a passage which extends substantially the length of the pipe housing between the spaced opposite ends thereof. Means including a heat producing portion of a laser are located adjacent to one end of the tubular housing, and during operation of the laser the heat producing portion produces heat in the fluid absorbing material thereat. The heat thus produced increases in pressure as heat is applied and occupies the spaced defined by and within the fluid absorbing material and is able to pass through the passage. The heat thus produced moves under the pressure produced through the passage toward the opposite end of the pipe housing where it is exposed to a cooler environment which causes cooling thereof. After cooling, the cooled fluid migrates back toward the opposite housing end for reheating by the heat producing means. The action thus described may be likened to a pumping action which efficiently pumps heat away from the heat producing areas.

In operation, the end of the housing where the heating takes place is closely adjacent to the laser medium or crystal so the heat generated by the medium is conducted directly to and through the thin copper shell pipe housing and causes heating of the fluid disposed within the fluid absorbing material adjacent thereto as aforesaid. As heat is absorbed at the adjacent end of the housing, the working fluid heats and travels through the passage toward the opposite housing end where the cooler portion of heat sink is located and causes the liquid to cool. As the liquid pressure builds within the tubular housing adjacent to the heat producing device or medium, the fluid carrying the heat moves ever more rapidly from the close in end of the housing toward the remote end and the process speeds up until it reaches an equilibrium. The fluid travels ever more rapidly as by capillary action through the fluid absorbing material toward the end of the housing where cooling is taking place. The process described is a continuous process in which the liquid contained in the heat pipe is heated and cooled in a continuous manner to carry heat away from the medium. In this manner, heat is continuously and efficiently transferred away from heat generating element or elements.

A heat dissipating element or heat sink is located near or adjacent to where the heated fluid is condensed in position to receive and then dissipate the heat. In this way, the heat pipe efficiently transfers heat from a heat generating element or medium to a heat sink where the heat enters the heat sink at a location that is remote from where the heating action takes place. The length and size of a heat pipe selected for a particular operation can vary as desired and as required taking into account the amount of heat generated and the distance between the laser medium and where the heat pipe makes contact with the heat sink.

The temperature differential from end-to-end, that is from the heating end to the cooling end of the heat pipe, has been found to be almost negligible because of the action of the liquid in transferring the heat throughout the length of the pipe. If the heat pipe, along its length, is positioned closely adjacent to a heat dissipating element or heat sink, the heat sink will absorb the heat from the pipe relatively uniformly along such portion of the length of the pipe and will relatively uniformly diffuse the heat that is produced. Thus, the present device produces extremely uniform and efficient heat dissipation.

The present device including the laser and the heat dissipation means is relatively lightweight and compact, has no moving parts and requires no maintenance. The present device also has no need for external power requirements and produces no noise, either audible or electrical. Therefore, the heat generating elements including the laser medium and the pump sources in a given laser can be more densely packed and can be mounted on high power component boards which is not always possible with known devices using known and more conventional heat dissipation means. The present invention therefore provides greater flexibility in the placement of the various laser components, provides a cooler operating environment and longer life for the components, and is able to maintain all of the components at or near an efficient operating temperature and without producing undesirable hot spots.

The present heat pipe lends itself to being mounted in more different configurations including on a base portion of a heat sink in position to extend along the length thereof. When the subject heat pipe is used to conduct heat away from a laser medium or crystal, it also limits the maximum operating temperature of the crystal. In this way the present heat pipe can be used to actively control the temperature of a crystal medium and to do so independently of other surrounding elements, including elements that may have different operating temperature requirements and different thermal gradients. Specifically, in a laser diode pumped laser, there are usually two main sources of heat, one being from the diode laser pump source or sources and the other from the laser medium or crystal itself. In known devices of this type, the heat generated from both sources is usually conducted to a common copper heat sink which in turn is soldered to a larger copper resonator base plate on which the laser medium is mounted. The present heat pipe construction is especially well suited to this type of construction.

In a typical construction using the subject heat pipe, the crystal gain medium is mounted in a groove in a base plate formed of a highly conductive material such as copper, and the diode laser pump source or sources are mounted on individual heat sinks located on one or both opposite sides of the crystal medium similar to the construction shown in Martin U.S. Pat. No. 4,864,584, issued Sept. 5, 1989. The crystal medium is also positioned in contact with a portion of heat conducting member usually in an overhead position, such as by a portion of a copper plate which is attached to the resonator base plate on which the laser medium is mounted by bolts with suitable insulating means to insulate the overhead conductive member from the conductive base plate on which the medium is mounted. The base plate in such a construction is soldered or otherwise attached to one or more thermoelectric cooler members which in turn are attached to the main heat sink also formed of a conductive substance such as copper, aluminum or other suitable material. The heat sink may have fins or other means against which air or some other coolant can be circulated to carry away heat therefrom. Another thermoelectric cooler is attached to the base plate member in contact with the laser medium and the opposite side is attached to a cooler which is in contact with a heat pipe constructed as described above. The purpose of the heat pipe, as stated above, is to efficiently and effectively extract heat more or less directly from the laser medium and independently of heat generated elsewhere in the device and to transfer it away from the portion of the conductive member that is in contact or close association with the laser medium to maintain the conductive member at a relatively constant temperature throughout.

In operation, as heat is generated in the crystal medium, the conductive member in contact therewith conducts the heat to and through the cooler in contact therewith to the heat pipe, which as explained above, actively transfers the heat to a remote location on the resonator base plate for dissipation. This operation actively and efficiently cools the crystal medium independently of the heat extraction means for other portions of the device and at the same time allows for arranging by stacking of the components of the laser for a very compact construction. The present construction therefore provides independent temperature control for the crystal medium and for the laser diode pump sources. It also requires only one principal heat sink, the copper resonator base plate, which receives heat generated by the laser medium and by the pump means. This is important for mechanical stability, compactness and for developing relatively high temperature gradients for efficient operation within a small volume.

In an alternate embodiment, the heat pipe is used to effectively transfer heat through a copper resonator base plate to and through thermoelectric coolers. The thermoelectric coolers are attached in spaced relationship along one surface of the copper resonator base plate at a location opposite from the laser diodes. The laser diodes in a typical construction are mounted on separate smaller heat sinks attached to the resonator base plate as aforesaid. The spaced thermoelectric coolers positioned on the opposite side of the base plate from the laser diodes may operate somewhat less efficiently than the other coolers in that they are more distant from the heat producing members or diodes than is true of the cooler means in contact with the the laser medium.

If the heat pipe is embedded in part in the resonator base plate, which is one possibility, the heat generated by the laser diodes will be even more rapidly and efficiently dispersed throughout the base plate. Furthermore, when the heat pipe is embedded in the resonator base plate, heat can be extracted and transferred even more rapidly in the plane of the base plate thereby enabling the laser to be maintained at an even lower and more desirable operating temperature. Still further, by using the subject heat pipe, the thermoelectric coolers that are used are used more effectively to dissipate heat and in a more uniform manner.

It is therefore an object of the present invention to provide more efficient means for extracting and transferring heat from an active element such as from a laser medium to a remote heat dissipation means such as to a heat sink device.

Another object is to maintain the active elements of a laser device at more efficient operating temperatures.

Another object is to provide means to maintain the temperature in a device such as a heat sink more uniform throughout.

Another object is to provide a relatively lightweight and compact heat transfer device for use with lasers and like devices.

Another object is to provide heat extracting and transferring means for use with lasers, which extracting and transferring means are relatively simple structurally and require no moving parts.

Another object is to provide heat extracting and transfer means which require no source of power to operate.

Another object is to provide heat transfer and extraction means which produce no audible or electrical noise.

Another object is to enable the construction of lasers that provide for greater versatility and compactness in the arrangement of their components and therefore can be made to be more compact.

Another object is to improve the operation and increase the output of a laser device by means which prevent overheating of the laser medium.

Another object is to teach the novel construction and operation of a heat pipe that is particularly useful for transferring heat away from an active element of a laser or like device.

Another object is to maintain more of the components mounted on a circuit board of a laser device at desirable operating temperatures and to eliminate the formation of hot spots.

Another object is to provide improved means for transferring heat from one member to another.

Another object is to increase the efficiency of laser devices that include elements that generate heat when operating.

Another object is to enable more compact stacking of the components of a laser device.

Another object is to teach the construction of heat transfer means for a laser device which assure that any relative movements between components that occur due to temperature changes will take place at locations remote from the active elements so as not to adversely effect the operation.

Another object is to use a common heat sink for a laser device that receives heat from the laser medium and from the pump source for dissipation.

Another object is to actively cool a laser medium or crystal located in an extremely small space independently of other elements.

These and other objects and advantages of the present invention will become apparent to those skilled in the art after considering the following detailed specification of preferred embodiments in conjunction with the accompanying drawings, wherein:

DETAILED DESCRIPTION OF THE DRAWINGS.

DETAILED DESCRIPTION OF THE PREFERRED EMBODIMENT

Figure 1:
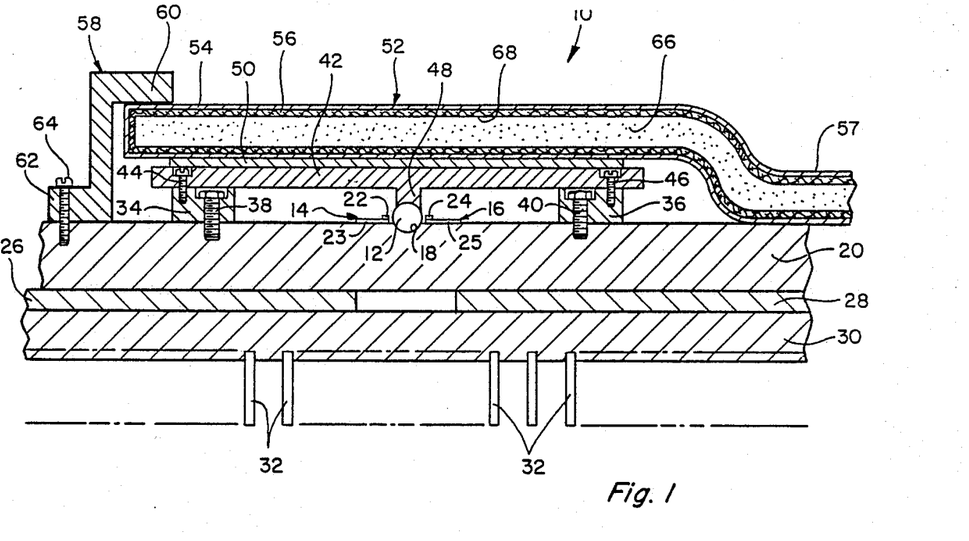
FIG. 1 is an enlarged fragmentary cross-sectional view through a laser device having heat extraction, transfer and dissipation means constructed according to the present invention.

Referring to the drawings more particularly by reference numbers, number 10 in FIG. 1 refers to a laser device such as a diode laser pumped laser device constructed according to one embodiment of the present invention. The device 10 includes a laser medium or crystal 12, a pair of spaced and opposed pump sources such as diode laser pump sources 14 and 16 aligned with the medium 12 on opposite sides thereof in the manner disclosed in Applicant's Patent No. 4,864,585, issued Sept. 5, 1989. The laser medium 12 is mounted in a groove 18 formed in heat conducting member or resonator 20 constructed of a highly heat conducting material such as copper. The pump sources 14 and 16 are each formed by a plurality, or array, of laser diodes 22 and 24 respectively. The laser diode arrays 22 and 24 are mounted on respective heat conductive members 23 and 25, and the electrical connections for the laser diode arrays 22 and 24 may also be similar to that disclosed in the above referenced patent application.

The heat conductive member 20 is shown mounted on or attached, as by soldering, to a plurality of thermoelectric coolers such as coolers 26 and 28 which in turn are attached in heat conducting relationship to a main heat sink member 30 shown having a plurality of attached parallel spaced fins 32. Air or some other coolant is circulated around and against the fins 32 to carry away the heat produced by the active elements of the device.

Attached to the surface of the member 20 opposite from the coolers 26 and 28 are insulating spacer members or blocks 34 and 36 shown connected thereto by respective threaded members 38 and 40. The insulator blocks 34 and 36 are provided to support an overhead heat conductive member 42 which is attached to the insulator blocks 34 and 36 by other respective threaded members 44 and 46. The conductive member 42 has an elongated downwardly extending flange 48 which is shown having a rounded surface positioned in surface-to-surface contact with the upper surface of the laser medium or crystal 12. This assures that the member 42 is in good heat conducting relationship with a substantial portion of the adjacent surface of the medium 12 so that the heat generated in the medium 12 during operation will have an easy heat flow path into the heat conductive member 42. It is important that the heat conducting member 42 be insulated from the member 20 by the insulating blocks 34 and 36 for reasons which will become apparent but is in surface-to-surface contact with another thermoelectric cooler 50 which may be soldered thereto to increase the heat conductivity therebetween.

The opposite side of the cooler 50 is attached to and is in good thermal conductivity with an outer conductive layer or surface of an elongated tubular member or heat pipe 52. The pipe 52 is a hollow structure, closed at both ends, and has an outer heat conductive layer 54 formed of a material such as copper, the inner surface of which is coated by a layer 56 of a fluid absorbing material. A remote end portion 57 of the heat pipe 52 is shown offset somewhat from the end portion in contact with the cooler 50 and this remote end portion is maintained in contact with the member 20 by suitable means. The end portion of the pipe 52 at the location of the cooler 50 is maintained attached to the member 20 by a flange shaped insulator member 58 which has a first leg portion 60 that bears against the end portion of the tube 52 and an opposite end leg portion 62 which is attached to the member 20 by threaded member 64.

The heat pipe 52 contains a quantity of a fluid which distributes itself relatively uniformly throughout the absorbent layer 56. Some of the fluid in the pipe that is located closely adjacent to the medium 12 is exposed to the heat generated in the medium 12 and will be heated and the speed of heating will build up sufficient pressure in the pipe 52 so that the liquid 66 will be forced to move through the pipe 52 toward the opposite cooler end thereof. The fluid pressure will reach an equilibrium state as long as the high temperature remains and this will continue to move the liquid 66 through the pipe. The heat produced will occupy the space 68 formed by and within the absorbent layer 56 near the end of the heat pipe 52 but as long as heat is being generated by the medium 12 which in turn is being cooled by the medium 50, fluid will continue to be heated and the build up in pressure will cause the liquid to move or migrate through the hollow space 68 in the pipe 52 toward the opposite or remote end thereof which is where the tube 52 is attached to and in heat conductive relationship with the heat conductive member 20. At this remote location the temperature of the member 20 will be cooler than closer in and the temperature gradient that exists between opposite ends of the pipe 52 will operate to further increase the flow of the heated fluid toward the cooler end of the pipe.

The lower temperature that exists at the remote pipe end causes the heated fluid 66 that reaches this location in the pipe 52 to cool and again become absorbed back into the absorbent layer 56 thereat where it moves back by capillary action toward the end of the pipe adjacent to the heat producing means or laser medium 12 for reevaporation. The operation of the present device in heating fluid in order to transfer the heat generated more rapidly away from the heat producing means during operation of the laser is unique to laser technology as a way of extracting and transferring heat and of maintaining the laser medium at a relatively low temperature for efficient operation. The efficient means described for carrying away heat and dissipating it substantially improves the laser operation and prevents undesirable thermal lensing, low conversion efficiency and prevents the formation of hot spots all of which can adversely affect the operation. Thus, it can be seen that with the construction described above, it is possible to extract heat from a laser medium independently of other elements including other heat extracting means associated with the laser such as the heat extracting means associated with the pump sources. This is highly desirable for the reasons stated. The present heat pipe therefore provides a way to selectively remove heat from a given area relatively rapidly and efficiently and is able to maintain a relatively uniform operating temperature along its length. This reduces or prevents the establishment of a temperature gradient in the member 42 and reduces the possibility of hot spots forming which can adversely affect the operation and limit the output of the laser.

It is important to understand that the present heat pipe construction enables the various components of a laser to be arranged more conveniently than in prior constructions including enabling arranging the components in a stacked relationship to one another as shown in FIG. 1. This substantially reduces the size and space required for the laser and for the heat sink means associated therewith. This is especially important for lasers that are used in applications where size and space is limited such as in certain medical applications such as eye surgery applications where small yet highly efficient lasers are required. Other applications have similar requirements.

Figure 2:
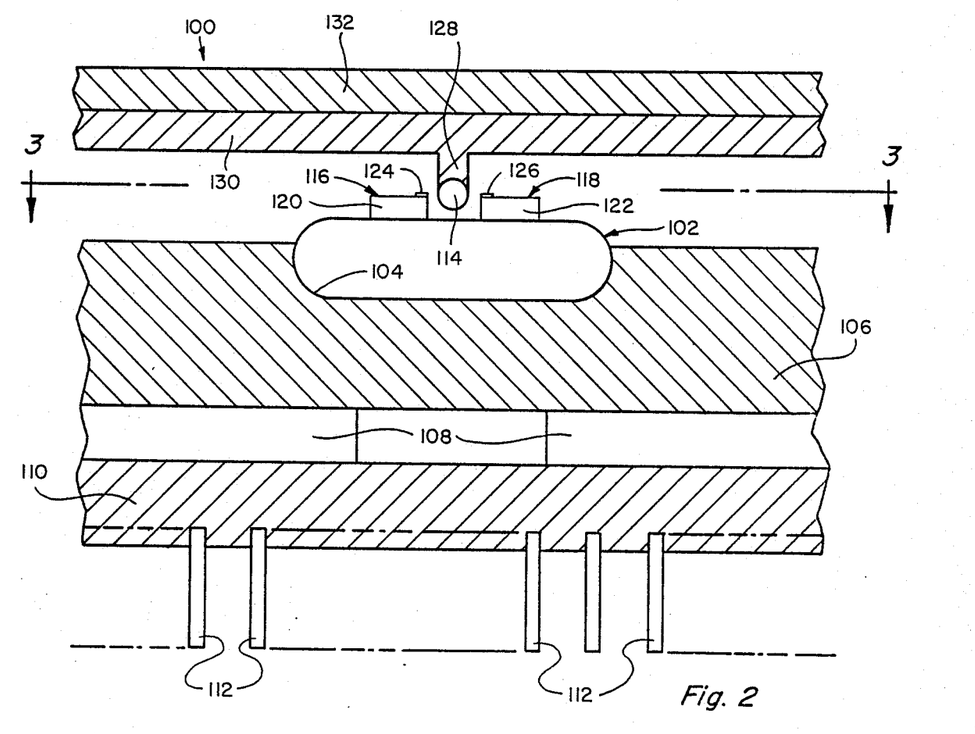
FIG. 2 is an enlarged cross-sectional view through another embodiment of a laser device constructed according to the present invention.

FIG. 2 shows another embodiment 100 of a laser construction using a heat pipe 102 where the heat pipe 102 is shown partially embedded in trough 104 formed in resonator member 106. The resonator 106 typically is constructed of a material such as copper and the outer layer of the heat pipe 102 is also copper or a like heat conductive material. It is important that there be good thermal conductivity between the members 102 and 106 for best operation. The resonator 106 is attached to a plurality of spaced thermoelectric coolers 108 which in turn are attached to a main heat sink member 110. The opposite side of the heat sink member 110 has a plurality of spaced outstanding fins 112 attached thereto, and during operation air is blown against the fins 112 for the usual purposes.

The device of FIG. 2 has a laser medium or crystal 114 and a laser diode pump source or sources 116 and 118 mounted directly on the heat pipe 102 on the opposite thereof from the resonator 106. The pump sources 116 and 118 each includes a respective heat sink portion 120 and 122 mounted on or attached to the heat pipe 102 and a respective laser diode array 124 and 126 constructed according to the teachings of co-pending Martin U.S. Pat. No. 4,864,584, issued Sept. 5, 1989. The crystal 114 is in surface-to-surface contact with a projecting flange 128 which is part of a heat sink member 130 as shown. The opposite surface of the member 130 is in contact with one or more thermoelectric coolers 132. In the construction 100 the heat generated in the crystal 114 is primarily removed by way of the flange 128 and the members 130 and 132 while the heat generated in the heat sinks 120 and 122 of the pump sources 116 and 118 is conducted into the heat pipe 102 where it heats the fluid contained therein and is conducted along the length thereof and into the resonator 106. From there the heat is conducted into the coolers 108 and into the heat sink 110. The laser construction 100 shown in FIG. 2 is a highly efficient laser because of the way heat generated in all of the active elements is conducted away from the laser elements and dissipated. The construction 100 has many of the same advantages as the construction shown in FIG. 1 including the ability to minimize heat differentials that otherwise might occur and to prevent hot spots from forming which can severely limit the operation and can cause damage. The present constructions therefore provide efficient means for extracting heat from the active laser elements and independently controlling the crystal temperature to avoid damage and improve the operation.

In all forms of the invention the member in contact with the crystal should be bonded thereto to improve the heat conduction between the crystal and the adjacent heat conducting member. The bonding can be accomplished by soldering, using a thermal epoxy or using relatively rigid clamp means to hold the members together in heat conducting relation. The mounting or bonding means selected should allow for thermal expansion and contraction of the adjacent parts or pads. Other adjacent components including the heat sinks and the coolers should also be bonded to each other for the same reasons.

The ability to cool the components of a laser in the manners illustrated, as stated, allows for stacking the components one on top of the other and yet also provides means for independently controlling and reducing the operating temperature of each. The present means also enable using only one surface portion of each active element for heat extraction which is important for mechanical stability and compactness. All of these things are very important because it is known that crystal mediums such as Nd:YAG crystal gain mediums have much better performance characteristics if they are operated relatively cool. Thermal lensing and poor conversion efficiency result if the crystal is allowed to operate at too high a temperature.

By using a heat pipe embedded or partially embedded into a resonator base plate as shown in FIG. 2, heat is even more rapidly and efficiently dispersed in the resonator and this means that the coolers located furthest from the heat source are more efficiently used. This is a further advantage of this construction.

It is usually necessary in order to efficiently extract heat from a heat source such as from the laser diode pump means to provide a plurality of thermoelectric coolers at spaced locations and over a relatively large area, usually an area much larger than the heat source itself. This enables taking better advantage of the characteristics of a device such as the heat pipes described above which, as stated, effectively spreads or distributes the heat more uniformly over substantially the entire area of the resonator base plate. In this way all of the coolers including those located remotely from the heat source are efficiently used. However, as explained, the heat pipe of the present invention, to be most effective, must have a temperature differential from end to end to produce the desired pumping action that most efficiently transfers heat therethrough. This is easily accomplished in devices of the sizes of the subject lasers which are usually relatively tiny. The important thing is to establish the desired heat pumping action which transfers and disperses the heat efficiently.

Figure 3:
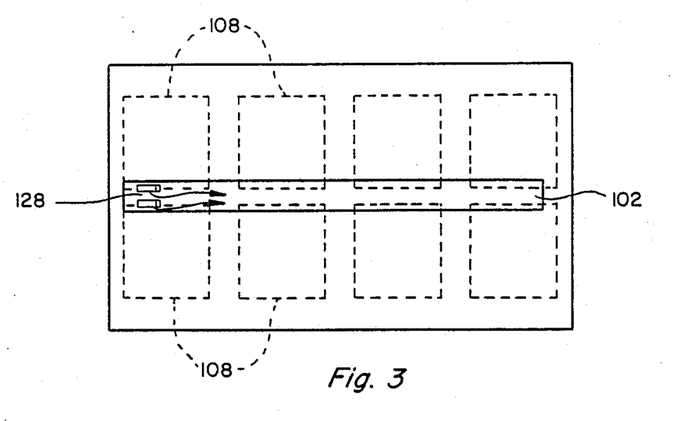
FIG. 3 is a cross-sectional view taken on line 3—3 of FIG. 2.

FIG. 3 is a cross-sectional view of the device shown in FIG. 2 with the relative positions of the heat pipe 102 and the coolers 108 shown more clearly.

Figure 4:
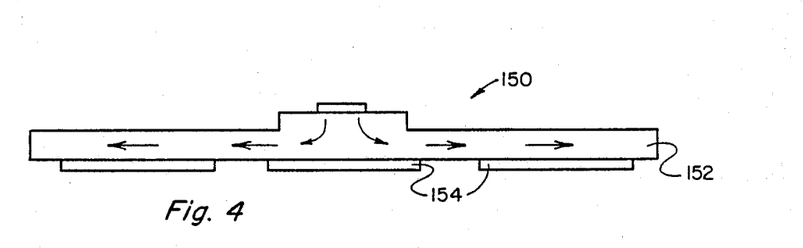
FIG. 4 is an end view showing another embodiment of laser heat extraction, transfer and dissipation means constructed according to the present invention.
Figure 5:
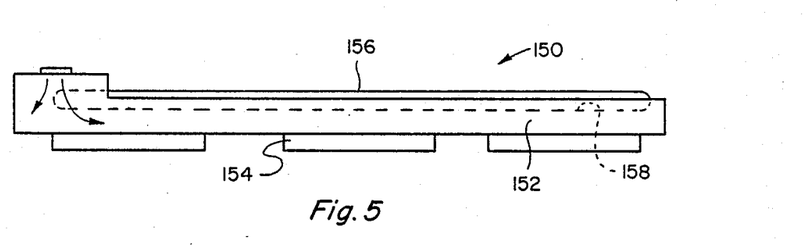
FIG. 5 is a right side view of the laser device of FIG. 4.

FIGS. 4 and 5 show different views of another embodiment 150 of the subject device showing a still different relationship between the relative positions of resonator 152 and the coolers 154. In this case as in the construction shown in FIGS. 2 and 3, heat pipe 156 is mounted in a groove 158 in the resonator member 152. FIG. 5 is a side view of the construction shown in FIG. 4 better illustrating the position of the heat pipe 156.

Figure 6:
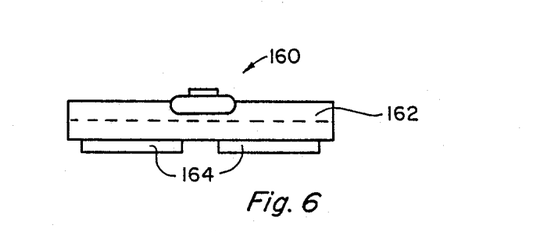
FIG. 6 is an end view showing yet another embodiment of the present invention.

FIG. 6 shows another embodiment 160 of a laser having a resonator 162 with coolers 164 attached thereto as shown.

From what has been shown and described it is apparent that many other combinations, arrangements and variations of the components can be made without departing from the spirit and scope of the invention.

Thus, there has been shown and described novel heat transfer means for cooling and transferring heat from the active elements of a laser device, which means fulfill all of the object and advantages sought therefor. It will be apparent to those skilled in the art, however, that many changes, variations, modifications, and other uses and applications of the subject device are possible and contemplated, and all such changes, variations, modifications, and other uses and applications which do not depart from the spirit and scope of the invention are deemed to be covered by the invention which is limited only by the claims which follow.

I claim:

1. Means to remove heat from a heat producing element of a laser comprising an elongated tubular member having a heat conductive outer layer closed at both opposite ends, a coating of fluid absorbing material on the inner surface of the outer layer forming a passageway therethrough, a heat transfer fluid positioned in the tubular member absorbed by the absorbent layer, a portion adjacent one end of the tubular member being positioned adjacent to a heat producing element of a laser so that the heat generated by the heat producing element will heat said portion of the tubular member, and a heat conductive member in heat conductive relationship to the tubular member at a location spaced from the heat producing element whereby heat generated in the tubular member heats the fluid in the tubular member adjacent thereto establishing a fluid pressure which forces the fluid to move through the passageway toward the location where the heat conductive member is in heat conductive relationship to the tubular member.

2. The means of claim 1 including a laser and cooler means positioned between the heat conductive member and the tubular member.

3. The means of claim 1 wherein the heat conductive member includes a resonator member, said resonator member including means for supporting the heat producing element, a source of pump energy mounted on the resonator member adjacent to the heat producing element and in position to pump energy produced therein into the heat producing element to cause the element to lase.

4. The means of claim 1 wherein the heat producing element is a solid state crystal laser rod.

5. The means of claim 3 wherein the source of pump energy includes a plurality of laser diodes.

6. The means of claim 1 wherein the heat conductive member includes means associated therewith for dissipating heat therefrom.

7. Means for extracting heat for dissipation from an active element of a laser device such as from a laser medium, the laser device having a laser medium and a pump source both mounted adjacent each other on a resonator member, the pump source being positioned and oriented to pump energy generated therein when energized into the laser medium to cause the laser medium to lase comprising a heat conductive member having a first portion in heat conductive relationship to the laser medium and a second connected portion, an elongated closed ended tubular member having an outer layer of heat conductive material, a portion of which tubular member is in heat conductive relation to the second connected portion of the heat conductive member, the inner surface of the outer layer of the tubular member having a layer of fluid absorbing material thereon forming a flow passage therethrough, the tubular member having a first end portion adjacent to the second connected portion of the heat conductive member and a second connected end portion remote therefrom, a fluid positioned in the tubular member absorbed by the fluid absorbing material, the heat generated by the laser medium during operation of the laser device heating absorbed fluid adjacent thereto in the tubular member, the pressure of the heated fluid causing the fluid to move through the passage formed by the absorbant material in the tubular member toward the second end portion, the resonator member being in heat conductive relation to the second tube end portion for receiving heat therefrom so that the fluid thereat is able to condense for reabsorption into the fluid absorbing material.

8. The means of claim 7 including a heat sink member in heat conductive relationship with the resonator member and with the remote second end portion of the tubular member.

9. The means of claim 8 including cooler means positioned between and in heat conductive relationship to the resonator member and to the heat sink member.

10. A laser device having a crystal laser medium and a source of pump energy including an array of laser diodes positioned adjacent thereto and oriented so that when the pump source is energized it will pump energy into the medium to cause the medium to lase further comprising means for conveying heat produced in the medium during operation of the laser away from the medium to a remote location for dissipation, said means including a heat conductive element having a first portion in heat conductive relation to the medium and a second portion spaced from the medium, and cooler means in heat conductive relation to the second portion.

11. In the laser device of claim 10 the means for conveying heat includes an elongated tubular heat pipe having an outer layer of heat conductive material, a layer of fluid absorbing material on the inner surface of the outer layer forming a passage therethrough, a heat transfer fluid positioned in the heat pipe and absorbed by the absorbant material, the laser medium and the source of the pump energy being located on one side of the heat pipe, a resonator member constructed of heat conductive material located on the opposite side of the heat pipe from the laser medium and the source of pump energy, means to attach the heat pipe to the resonator member in heat conductive relationship thereto, and a heat sink in thermal conductive relationship to the resonator.

12. In the laser device of claim 11 the improvements further include spaced thermoelectric cooler members positioned between the resonator member and the heat sink.

13. In the laser device of claim 10 wherein the laser medium is a solid state laser rod and the source of pump energy includes at least one array of laser diodes.

14. In the laser device of claim 11 the improvements further comprising a groove formed in the resonator member and means for mounting the heat pipe in the groove whereby a portion of the heat pipe is in surface-to-surface heat conductive relation to the resonator.

15. Means to remove heat produced by a heat producing element of a laser device having a laser medium and a pump source positioned adjacent thereto and oriented so that when energized the pump source will pump energy into the medium to stimulate the medium to lase comprising a main heat sink for the laser device, means to convey heat produced by the laser medium to the heat sink for dissipation therein, said heat conveying means including an elongated tubular heat pipe having an outer conductive layer and a layer of fluid absorbant material on the inner surface thereof forming a passage therethrough, a heat transfer fluid positioned in the heat pipe, said heat pipe having a first portion positioned adjacent to the laser medium and a second portion remote therefrom in heat conductive relation to the heat sink, a heat conductive member having a first portion positioned adjacent to and in heat conductive relationship to the laser medium, said first portion receiving heat produced by the laser medium and heating the absorbed fluid in the heat pipe adjacent thereto, the heated fluid moving through the passage formed by the absorbant material toward the second remote portion of the heat pipe where heat carried in the heated fluid is conducted into the heat sink.

16. The means of claim 15 including a thermo conductive cooler member positioned between the heat conductive member and the heat pipe.

17. The means of claim 15 including means to insulate the first portion of the heat pipe and the heat conductive member adjacent thereto from the heat sink.

18. Means to remove heat from the heat producing elements of a laser device wherein the heat producing elements include a laser medium and a pump source, the pump source being oriented so that when energized the pump source will pump energy into the medium to stimulate the medium to lase comprising a resonator member of heat conductive material having an elongated groove formed in one surface thereof, an elongated closed end heat pipe positioned in the groove in heat conductive relationship with the resonator and extending from one end positioned adjacent to the laser medium and pump source to a remote opposite end, means for mounting both the laser medium and the pump source on the heat pipe on the side thereof opposite from the side positioned in the groove in the resonator in heat conductive relationship thereto, a heat conductive member having a portion in heat conductive relationship to the laser medium on the opposite side thereof from the heat pipe, and thermo electric cooler means in heat conductive relationship with the heat conductive member on the opposite side thereof from the medium.

19. The means of claim 18 wherein the heat pipe has an outer heat conductive layer with an inner surface, a layer of liquid absorbing material on the inner surface forming a passageway through the heat pipe, and a heat transfer fluid positioned in the heat pipe and absorbed into the layer of absorbant material, fluid in the heat pipe adjacent to the laser medium heating when the laser is operated by the heat generated by the laser medium and by the pump source, the pressure of the heating of the fluid in the heat pipe reaching an equilibrium condition adjacent to the laser medium forcing the heated fluid produced thereat to move through the passage in the heat pipe toward the remote opposite end thereof.

* * * * *

UNITED STATES PATENT AND TRADEMARK OFFICE
CERTIFICATE OF CORRECTION

PATENT NO. : 4,901,324

DATED : February 13, 1990

INVENTOR(S) : Danny W. Martin

It is certified that error appears in the above-identified patent and that said Letters Patent is hereby corrected as shown below:

The title page showing the illustrative figure should be deleted to appear as per attached title page.

Signed and Sealed this

Eleventh Day of June, 1991

*Attest:*

HARRY F. MANBECK, JR.

*Attesting Officer*    Commissioner of Patents and Trademarks

United States Patent [19]
Martin

[11] Patent Number: 4,901,324
[45] Date of Patent: Feb. 13, 1990

[54] HEAT TRANSFER DEVICE FOR COOLING AND TRANSFERRING HEAT FROM A LASER DIODE DEVICE AND ASSOCIATED HEAT GENERATING ELEMENTS

[75] Inventor: Danny W. Martin, St. Charles, Mo.

[73] Assignee: Laser Diode Products, Inc., Earth City, Mo.

[21] Appl. No.: 286,069

[22] Filed: Dec. 19, 1988

[51] Int. Cl.⁴ ................................................ H01S 3/04
[52] U.S. Cl. ............................................ 372/36; 372/35
[58] Field of Search ...................... 372/36, 34, 35, 33, 372/41, 72, 75

[56] References Cited

U.S. PATENT DOCUMENTS

| | | | |
|---|---|---|---|
| 3,482,185 | 12/1969 | Smith et al. | 372/36 |
| 4,791,634 | 12/1988 | Miyake | 372/34 |
| 4,805,177 | 2/1989 | Martin et al. | 372/36 |

FOREIGN PATENT DOCUMENTS 0284980 12/1986 Japan ..................................... 372/35

*Primary Examiner*—Frank Gonzalez

*Attorney, Agent, or Firm*—Haverstock, Garrett & Roberts

[57] ABSTRACT

In a laser device having a laser medium and a laser pumping device associated therewith the improvement including an apparatus for efficiently dissipating heat generated in the laser medium to maintain the laser medium at a more suitable operating temperature, the apparatus including an elongated closed ended heat pipe having a first portion in closely spaced proximity and in heat conductive relationship to the laser medium and a second remote end portion in heat conductive relationship to a heat sink, the heat pipe having an outer conductive layer with a coating of a fluid absorbing material positioned therein and forming a passage therethrough, and a heat transfer fluid positioned in the heat pipe and absorbed by the absorbent material, the absorbed fluid adjacent to the laser medium heating when exposed to the heat generated in the laser medium whereby the fluid moves through the heat pipe to a remote location for conduction of the heat therein into the heat sink.

19 Claims, 2 Drawing Sheets